United States Patent
Sywyk

[11] Patent Number: 5,715,205
[45] Date of Patent: Feb. 3, 1998

[54] MEMORY WITH A SELECTABLE DATA WIDTH AND REDUCED DECODING LOGIC

[75] Inventor: Stefan P. Sywyk, San Jose, Calif.

[73] Assignee: Cypress Semiconductor Corporation, San Jose, Calif.

[21] Appl. No.: 624,182

[22] Filed: Mar. 29, 1996

[51] Int. Cl.[6] .................................. G11C 7/00
[52] U.S. Cl. ................ 365/219; 365/220; 395/497.02
[58] Field of Search ........................ 365/219, 220, 365/189.02; 395/307, 497.02

[56] References Cited

U.S. PATENT DOCUMENTS

| | | | |
|---|---|---|---|
| 4,286,321 | 8/1981 | Baker | 364/200 |
| 4,975,880 | 12/1990 | Knierim | 365/189.02 |
| 5,055,661 | 10/1991 | Gochi | 365/189.02 |
| 5,262,990 | 11/1993 | Mills | 365/189.02 |
| 5,373,467 | 12/1994 | Wang | 365/189.02 |
| 5,396,460 | 3/1995 | Harada | 365/220 |
| 5,504,875 | 4/1996 | Mills | 395/497.02 |
| 5,546,347 | 8/1996 | Ko et al. | 365/221 |

*Primary Examiner*—David C. Nelms
*Assistant Examiner*—Son Mai
*Attorney, Agent, or Firm*—Oblon, Spivak, McClelland, Maier & Neustadt, P.C.

[57] ABSTRACT

A method is described that writes a first and a second data of a first data width into a memory that stores data at a second data width greater than the first data width. The method includes the step of selecting via a select circuit a plurality of memory cells that correspond to the second data width from a memory array of the memory. The first data is then written into a first number of the memory cells corresponding to the first data width while writing invalid data into a second number of the memory cells also corresponding to the first data width during a first write operation. The second data is then written into the second number of the memory cells while again writing the first data into the first number of the memory cells during a second write operation. A memory that can operate with either the first data width or the second data width without changing its column select circuit is also described.

19 Claims, 10 Drawing Sheets

MEMORY WITH A SELECTABLE DATA WIDTH AND REDUCED DECODING LOGIC

FIELD OF THE INVENTION

The present invention pertains to the field of computer memories. More particularly, this invention relates to a memory that has a selectable data width and minimal decoding logic corresponding to the selectable data width.

BACKGROUND OF THE INVENTION

A prior art memory typically includes a memory array for storing data and a decoding circuit for addressing the memory array based on addresses applied. Data can be written into and then read from the memory array at addresses. The decoding circuit receives an address and then selects a memory location of the memory array based on the address received. Data is then written into or read from the addressed memory location via data pins of the memory.

One category of the prior art memory typically has nine data pins (i.e., nine bits wide). Memory devices with nine-bit data pins are typically employed in electronic systems that have a nine-bit bus for data transfer.

Another category of the prior art memory typically has eighteen data pins (i.e., eighteen bits wide). Memory devices with eighteen-bit data pins are typically employed in electronic systems that have an eighteen-bit bus for data transfer.

One disadvantage of the prior art nine-bit wide memory is that a single nine-bit wide memory typically cannot be connected to an eighteen-bit bus. Two such memories are typically used to satisfy an eighteen-bit bus requirement. This typically increases printed circuit board area which typically translates into higher cost. In addition, this also reduces overall system reliability.

One disadvantage of the prior art eighteen-bit wide memory is that when the memory is connected to a nine-bit bus, half of the data pins of the memory are not connected and are thus left floating. Moreover, only one-half of the storage capacity of the eighteen-bit wide memory is used when the device is connected to the nine-bit bus.

One prior solution is to provide a memory that has eighteen data pins and a column select circuit that selects nine memory cells from a memory array in accordance with an address (i.e., a nine-bit wide column select circuit). A data width control signal is then used to control the column select circuit to select nine memory cells for each address applied when the memory is used as a nine-bit wide memory. In this case, only half of the data pins of the memory are used to pass data to and from the memory array of the memory. When the memory is used as an eighteen-bit wide memory, the column select circuit is controlled to select eighteen memory cells for each address applied. In this case, some logic gates (i.e., the eighteen-to-nine selection logic gates) of the column select circuit are disabled and all of the eighteen data pins of the memory pass data to and from the memory array of the memory. This thus allows a memory to be used in both the nine-bit data width environment and the eighteen-bit data width environment.

Disadvantages are, however, still associated with this prior approach. One disadvantage is that the memory requires the nine-bit wide column select circuit. As is known, a nine-bit wide column select circuit typically requires relatively much more logic gates to control the column select circuit than an eighteen-bit wide column select circuit. This typically causes some excessive logic gates in the column select circuit when the memory is used as an eighteen-bit wide memory.

SUMMARY OF THE INVENTION

One of the features of the present invention is to allow a memory to have a selectable data width and minimal decoding logic for the selectable data width.

Another feature of the invention is to provide a multi-data-width memory with reduced column selection.

A further feature of the present invention is to allow a memory to operate with a reduced data width while the column selection logic of the memory still maintains the unreduced data width selection.

A method is described that writes a first and a second data of a first data width into a memory that stores data at a second data width greater than the first data width. The method includes the step of selecting via a select circuit a plurality of memory cells that correspond to the second data width from a memory array of the memory. The first data is then written into a first number of the memory cells corresponding to the first data width while writing invalid data into a second number of the memory cells also corresponding to the first data width during a first write operation. The second data is then written into the second number of the memory cells while again writing the first data into the first number of the memory cells during a second write operation.

A memory is described that includes a memory array and a select circuit which selects a plurality of memory cells that correspond to a first data width from the memory array. A first pass circuit is provided that, when enabled, passes a first data of a second data width less than the first data width to the select circuit. A second pass circuit is provided that, when enabled, passes a second data having the second data width to the select circuit. A configurable control circuit is provided that enables the first and second circuits. When the control circuit is configured to enable the first and second pass circuits at substantially the same time, the memory operates with the first data width. When the control circuit is configured to enable the first and second pass circuits alternately, the memory operates with the second data width without changing the select circuit.

BRIEF DESCRIPTION OF THE DRAWINGS

The present invention is illustrated by way of example and not by way of limitation in the figures of the accompanying drawings, in which like references indicate similar elements and in which.

DETAILED DESCRIPTION

Figure 1:
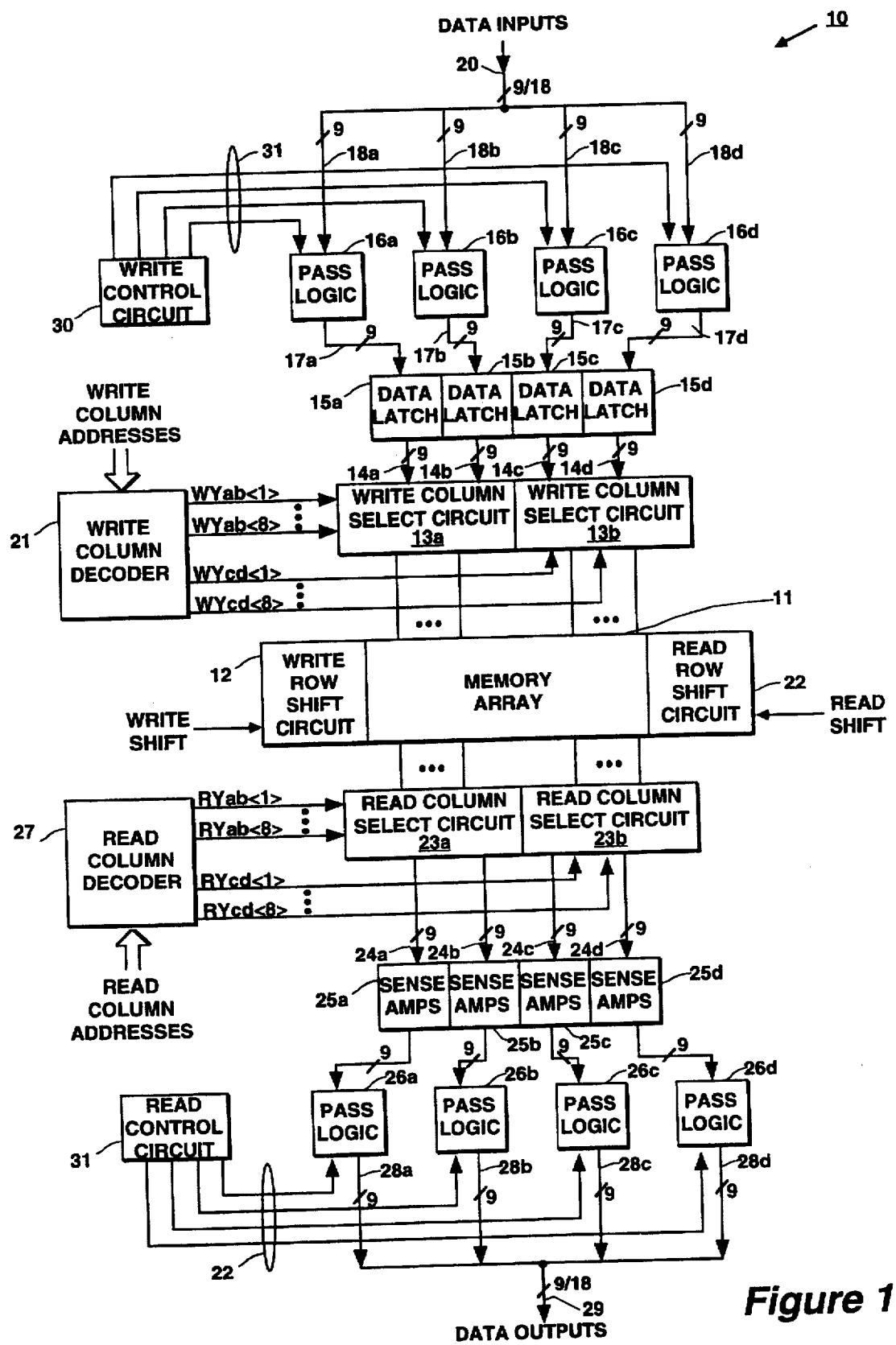
FIG. 1 shows the structure of a memory with a selectable data width in accordance with one embodiment of the present invention.

FIG. 1 schematically illustrates the architecture of a memory 10 that has a selectable data width and a column select circuit (i.e., circuits 13a and 13b) with reduced selection logic in accordance with one embodiment of the present invention. In one embodiment, memory 10 is a first-in-first-out ("FIFO") memory.

As can be seen from FIG. 1, memory 10 includes a memory array 11, a write row shift circuit 12, a column decoder 21, and write column select circuits 13a and 13b. Shift circuit 12 can also be replaced with a row decoder.

Memory array 11 is organized into rows and columns. A memory cell is placed at each intersection of a row line and a column line, thus forming memory array 11.

Memory 10 can be used in any kind of computer systems or data processing and/or data transmission systems. In addition, memory 10 can be implemented by any type of memory. For example, memory 10 can employ RAM ("Random Access Memory") cells, EPROM ("Electrically Programmable Read-Only Memory") cells, or flash EPROM ("flash Erasable and electrically Programmable Read-Only Memory") cells. In addition, other types of memory cells can also be used in memory 10.

In one embodiment, all of the circuit of memory 10 shown in FIG. 1 resides on a single semiconductor substrate.

Write shift circuit 12 is connected to the row lines of memory array 11. Write shift circuit 12 is typically formed by a number of shift registers (not shown) connected together in a closed loop. A shift control signal WRITE SHIFT is applied to control the shift operation of shift circuit 12 such that the rows of memory array 11 can be sequentially selected. The circuit and operation of Write shift circuit 12 will not be described in detail below in order not to unnecessarily obscure the description of the present invention.

The column lines of memory array 11 are connected to column select circuits 13a and 13b. Each of write column select circuits 13a and 13b is used, in one embodiment, to select eighteen column lines simultaneously from memory array 11 for each column address applied to column decoder 21. Each of write column select circuits 13a and 13b is enabled by one of WYab<1:8> and WYcd<1:8> select signals. WYab<1:8> are eight sequentially activated WYab signals. WYcd<1:8> are eight sequentially activated WYcd signals. When the WYab<1:8> signal is asserted, columns select circuit 13a is enabled to select eighteen column lines from memory array 11. When the WYcd<1:8> signal is asserted, write column select circuit 13b is enabled to select a different group of eighteen column lines from memory array 11. The WYab<1:8> and WYod<1:8> select signals are also generated by write column decoder 21 in accordance with the column address applied. For any given column address, write column decoder 21 only asserts one of the WYab<1:8> and WYcd<1:8> signals. Write column select circuits 13a and 13b will be described in more detail below.

Each of write column select circuits 13a and 13b is connected to write column decoder 21. Write column decoder 21 decodes a column address received and controls the enabled one of write column select circuits 13a and 13b to select eighteen columns. Write column decoder 21 can be implemented by any known decoding circuit.

Write column select circuit 13a is connected to data latches 15a and 15b via data buses 14a and 14b. Write column select circuit 13b is connected to data latches 15c and 15d via data buses 14c and 14d. Data latches 15a–15b are in turn connected to data inputs 20 of memory 10 via pass logic circuits 16a and 16b. Data latches 15c and 15d are connected to data inputs 20 of memory 10 via pass logic circuits 16c and 16d. As can be seen from FIG. 1 and in accordance with one embodiment, each of data latches 15a–15d is nine bits wide and data inputs 20 of memory 10 are either nine bits wide or eighteen bits wide. This allows memory 10 to have a selectable data width between nine bits and eighteen bits. Alternatively, data inputs 20 of memory 10 can have different pin numbers. For example, data inputs 20 can have either eight pins (i.e., byte wide) or sixteen pins (i.e., word wide).

When data inputs 20 of memory 10 are nine bits wide (i.e., nine data pins), each of data buses 18a through 18d is connected to the data inputs. When data inputs 20 of memory 10 are eighteen bits wide (i.e., eighteen data pins), data buses 18a and 18c are connected to the first half of data inputs 20 to receive the first half of an eighteen-bit data and data buses 18b and 18d are connected to the second half of data inputs 20 to receive the second half of the eighteen-bit data.

Figure 4:
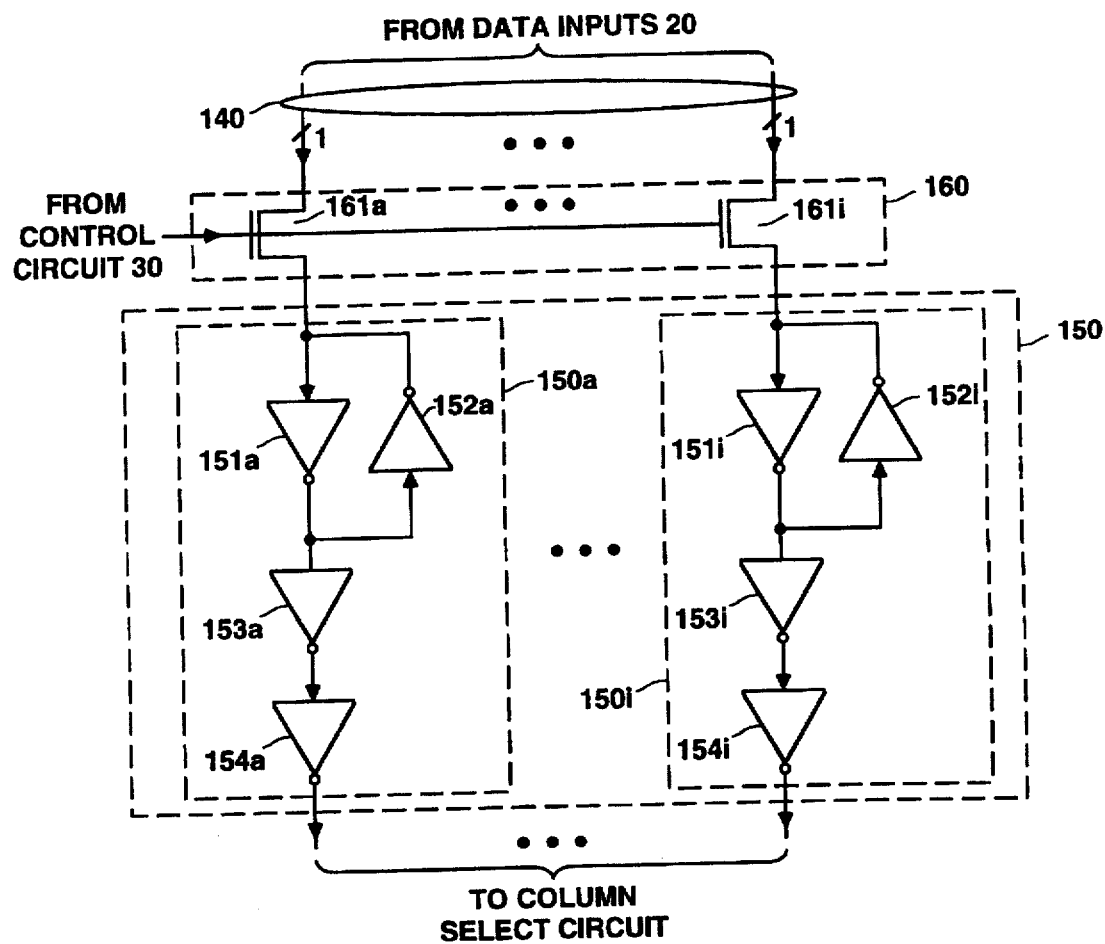
FIG. 4 shows the circuit of one of the pass logic circuits and the data latch circuits of FIG. 1.

Each of pass logic circuits 16a through 16d is controlled by write control circuit 30 via one of signal lines 31 to be turned on and off. When a pass logic is turned on by write control circuit 30, it passes a nine-bit data from the respective one of buses 18a . 18d to the respective one of data latches 15a through 15d. For example, when pass logic 16a is turned on or enabled by control circuit 30, the nine-bit data on bus 18a is written into data latch 15a via data bus 17a. The circuit of each of pass logic circuits 16a–16d and each of data latches 15a–15d is shown in FIG. 4, which will be described in more detail below.

Figure 5:
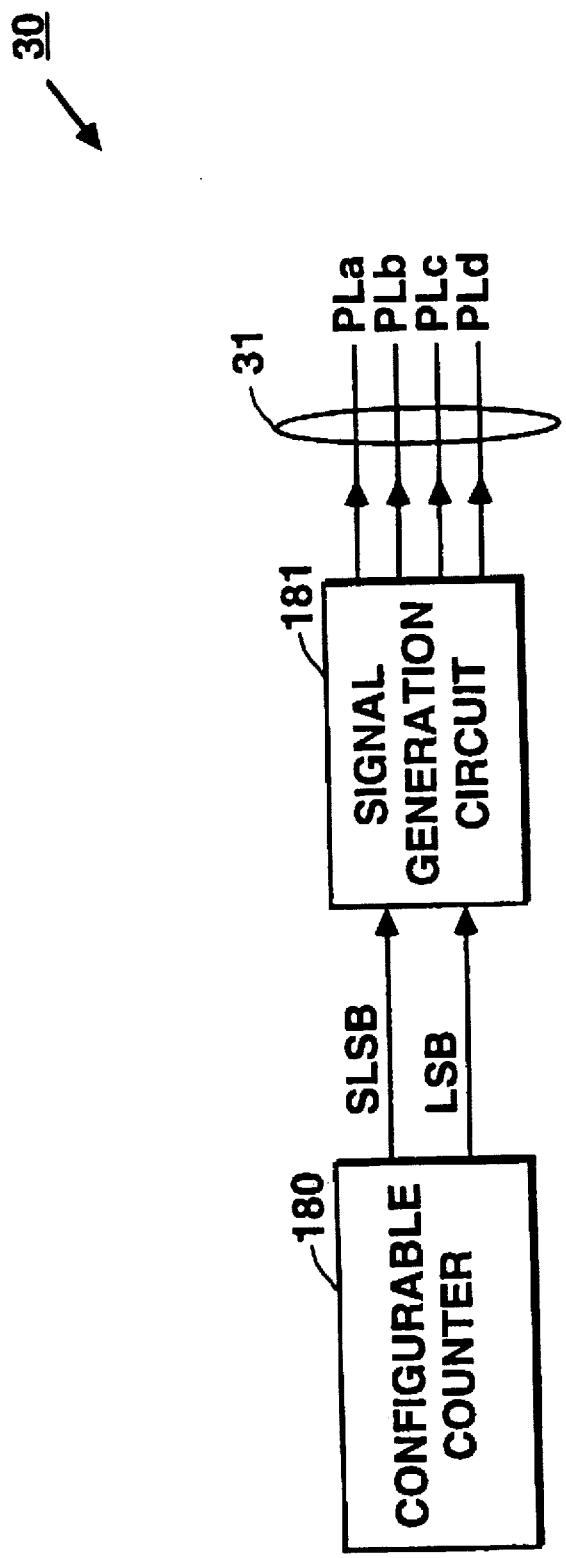
FIG. 5 shows the circuit of the control circuit of FIG. 1, wherein the control circuit has a counter and a signal generation circuit.
Figure 6:
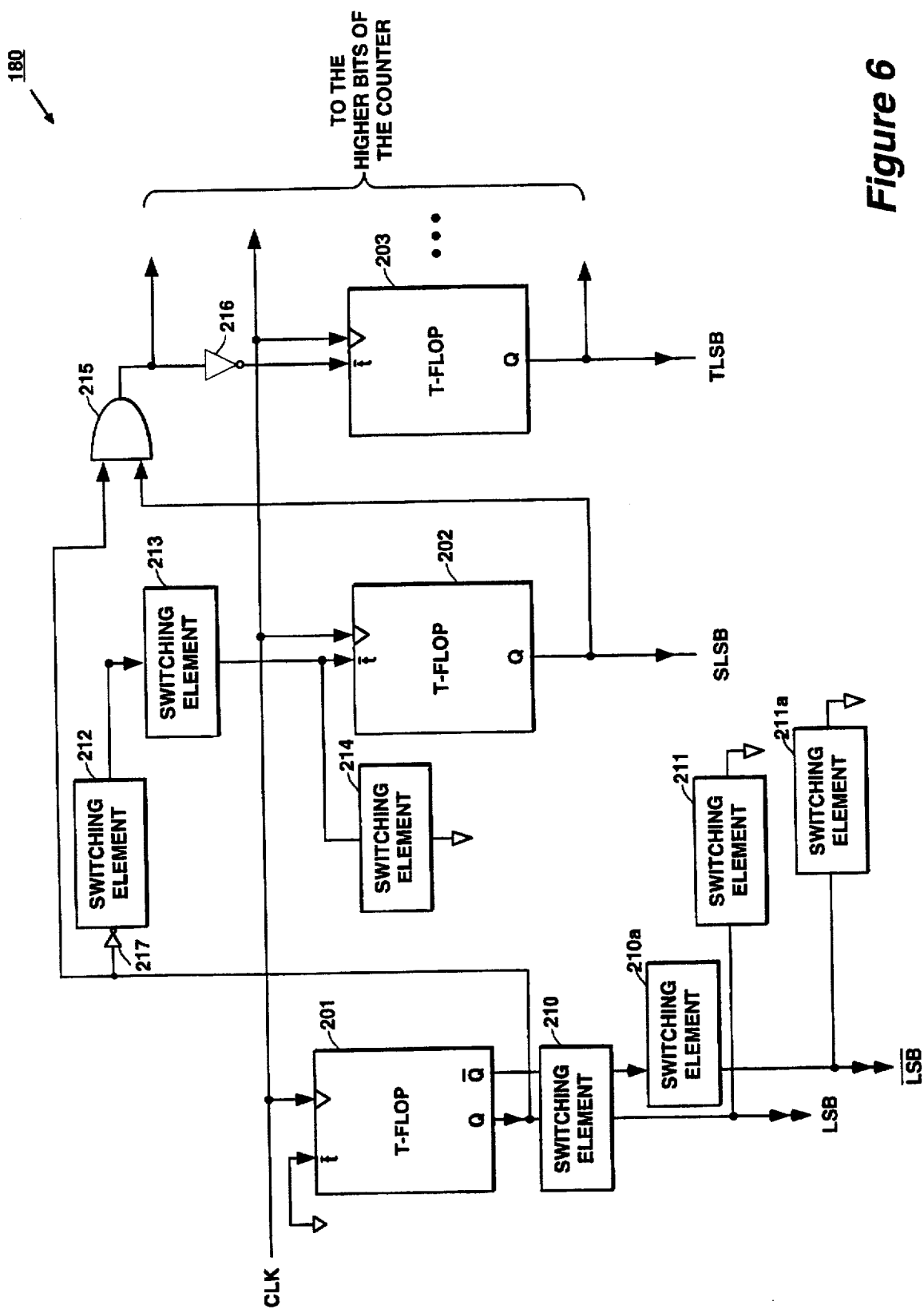
FIG. 6 shows the circuit of the counter of FIG. 5.
Figure 7:
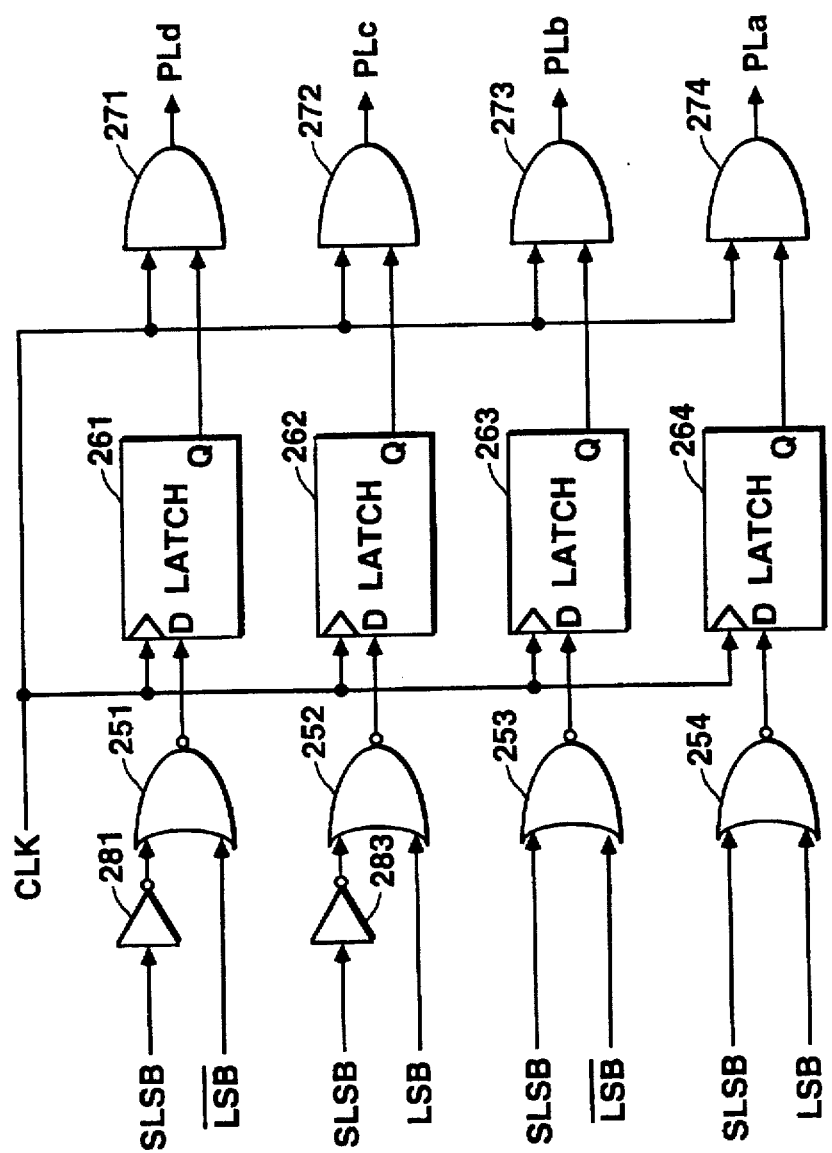
FIG. 7 shows the circuit of the signal generation circuit of FIG. 5.

Write control circuit 30 is reconfigurable. For example, control circuit 30 can be initially configured to control pass logic circuits 16a and 16b to be turned on together at the same time and then pass logic circuits 16c and 16d to be turned on together at the same time. This means that if control circuit 30 is initially configured to turn on pass logic circuits 16a and 16b and then pass logic circuits 16c and 16d, memory 10 receive and store a data that is eighteen bits wide. When control circuit 30 is reconfigured, it controls each of pass logic circuits 16a–16d to be individually turned on sequentially. This thus allows memory 10 to receive and store a nine-bit wide data. In this case, data inputs 20 are nine bits wide. The reconfiguration of control circuit 30 can be done either by the user or during the fabrication process (i.e., through metal option or laser beam trimming). The circuit of control circuit 30 is shown in FIGS. 5–7, which will be described in more detail below.

Referring back to FIG. 1, each of data buses 14a–14d, 17a–17d, and 18a–18d is nine bits wide. This is because data inputs 20 of memory 10 have either nine data pins or eighteen data pins, as described above. It is, however, to be noted that the width of each of data buses 14a–14d, 17a–17d, and 18a–18d is not limited to nine bits and is only determined in accordance with the width of data inputs 20 of memory 10. Similarly, the width of each of pass logic circuits 16a–16d and the width of each of data latches 15a–15d are not limited to nine bits and are also determined in accordance with the data width of data inputs 20. Again, FIG. 1 only illustrates one embodiment of the present invention. It will be evident that changes can be made to the width of (1) the data buses, (2) the pass logic circuits, and (3) the data latches without departing from the spirit and scope of the present invention.

Each of write column select circuits 13a and 13b can be implemented by any known column gating circuit and typically includes a number of gating transistors (not shown). The gating transistors of write column select circuits 13a and 13b are connected between the column lines of memory array 11 and data buses 14a–14d. The gating transistors of write column select circuit 13a are controlled by column decoder 21 to connect (1) data bus 14a to the first half of another eighteen selected column lines (i.e., nine column lines) and (2) data bus 14b to the second half of the eighteen selected column lines (i.e., nine column lines). Similarly, the gating transistors of write column select circuit 13b are controlled by write column decoder 21 to connected (1) data bus 14c to the first half of another eighteen selected column lines and (2) data bus 14b to the second half of the eighteen selected column lines. Each of the write column select circuits 13a–13b selects different eighteen column lines from memory array 11.

As described above, each of write column select circuits 13a–13b is constructed to select eighteen column lines for each write column address applied to column decoder 21. This allows each of column select circuits 13a–13b to have only half of the control signal lines that a conventional column select circuit for selecting nine column lines from memory array 11 would have. This also allows the present invention to have half of the control logic to control the write column select circuits 13a and 13b.

Read shift circuit 22 is connected to the row lines of memory army 11. Read shift circuit 22 is typically formed by a number of shift registers (not shown) connected together in a closed lccp. A shift control signal READ SHIFT is applied to control the shift operation of shift circuit 22 such that the rows of memory array 11 can be sequentially selected. The circuit and operation of Read shift circuit 22 will not be described in detail below in order not to unnecessarily obscure the description of the present invention.

The column lines of memory array 11 are connected to read column select circuits 23a and 23b. Each of read column select circuits 23a and 23b are used, in one embodiment, to select eighteen column lines simultaneously from memory array 11 for each column address applied to read column decoder 27. Each of read column select circuits 23a and 23b is enabled by one of RYab<1:8> and RYcd<1:8> select signals. RYab<1:8> are eight sequentially activated RYab signals. RYcd<1:8> are eight sequentially activated RYcd signals. When the RYab<1:8> signal is asserted, read column select circuit 23a is enabled to select eighteen column lines from memory array 11. When the RYcd<1:8> signal is asserted, read column select circuit 23b is enabled to select a different group of eighteen column lines from memory array 11. The RYab<1:8> and RYcd<1:8> select signals are also generated by read column decoder 27 in accordance with the column address applied. For any given column address, read column decoder 27 only asserts one of the RYab<1:8> and RYcd<1:8> signals. Read column select circuits 23a and 23b will be described in more detail below.

Each of read column select circuits 23a and 23b is connected to read column decoder 27. Read column decoder 27 decodes a column address received and controls the enabled one of read column select circuits 23a and 23b to select eighteen columns. Read column decoder 27 can be implemented by any known decoding circuit.

Read column select circuit 23a is connected to sense amplifiers 25a and 25b via data buses 24a and 24b. Read column select circuit 23b is connected to sense amplifiers 25c and 25d via data buses 24c and 24d. Sense amplifiers 25a–25b are in turn connected to data outputs 29 via pass logic circuits 26a and 26b. Sense amplifiers 25c and 25d are connected to data outputs 29 via pass logic circuits 26c and 26d. As can be seen from FIG. 1 and in accordance with one embodiment, each of sense amplifiers 25a–25d is nine bits wide and data output 29 to data bus (not shown) are either nine bits wide or eighteen bits wide.

Each of pass logic circuits 26a through 26d is controlled by a read control circuit 31 via one of signal lines 22 to be turned on and off. When a pass logic is turned on by read control circuit 31, it passes a nine-bit data from the respective one of sense amplifiers 25a through 25d to one of buses 28a–28d respectively. For example, when pass logic 26a is turned on or enabled by control circuit 21, the nine-bit data in sense amplifier 25a is sent to bus 28a. The circuit of each of pass logic circuits 16a–16d and each of data latches 15a–15d is shown in FIG. 4, which will be described in more detail below. Read control circuit 31 is reconfigurable and operates similarly to write control circuit 21.

Figure 2A:
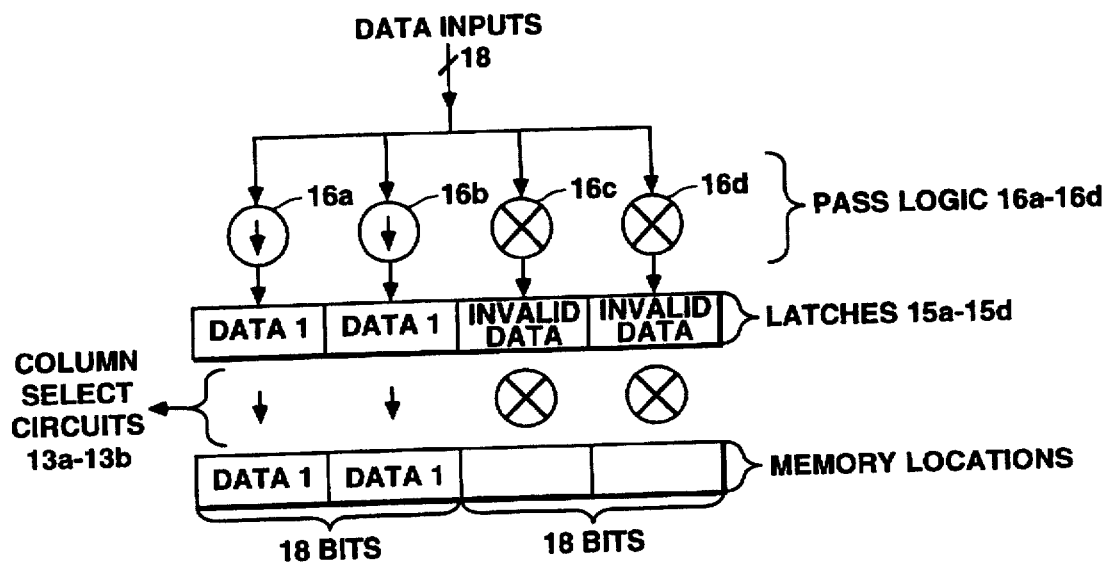
FIGS. 2A and 2B schematically show the write operation of the memory of FIG. 1 when the memory is configured to have an eighteen-bit data width.
Figure 2B:
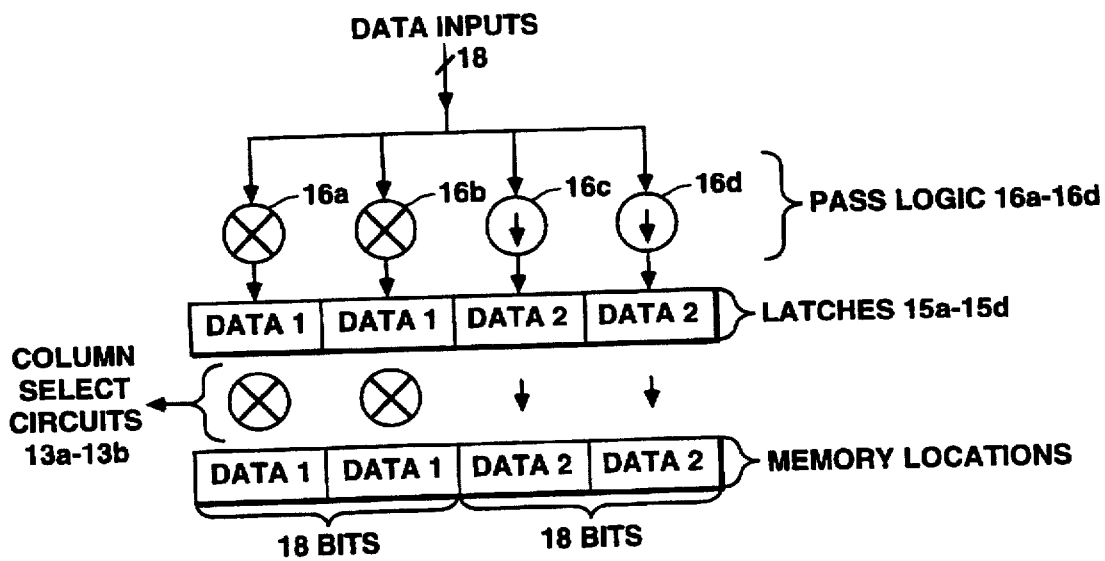

FIGS. 2A and 2B schematically illustrate the write operation of memory 10 when memory 10 has an eighteen-bit data width (i.e., data inputs 20 have eighteen data pins). As can be seen from FIGS. 1 and 2A–2B, when memory 10 has the eighteen-bit data width, control circuit 30 is configured to turn on pass logic circuits 16a and 16b together and then pass logic circuit 16c and 16d together. This causes either data latches 15a and 15b or data latches 15c and 15d to receive an eighteen-bit data from data inputs 20. For example, when an eighteen-bit data DATA1 is received at data inputs 20, control circuit 30 turns on pass logic circuits 16a and 16b while turning off pass logic circuits 16c and 16d. This causes DATA1 to be applied to data latches 15a and 15b while data latches 15c and 15d do not receive any data from data inputs 20 (see FIG. 2A). In addition, write column select circuit 13a is enabled by the WYab<1:8> signal while write column select circuit 13b is disabled. Write column select circuit 13a then selects eighteen column lines from memory array 11. The first half of DATA1 in data latch 15a is then stored in the first half of the eighteen selected memory cells and the second half of DATA1 in data latch 15b is then stored in the second half of the selected memory cells (see FIG. 2A). This thus completes the write operation for DATA1.

When data inputs 20 of memory 10 receives another eighteen-bit data DATA2, control circuit 30 causes pass logic circuits 16a and 16b to be turned off and pass logic circuits 16c and 16d to be turned on (see FIG. 2B). This causes DATA2 to be stored into data latches 15c and 15d while data latches 15a and 15b do not receive any data from data inputs 20. Meanwhile, write column select circuit 13b is enabled by the WYcd<1:8> signal while write column select circuit is 13a is disabled by the WYab<1:8> signal. Column select circuit 13b then selects eighteen column lines to receive DATA2 stored in data latches 15c and 15d (see FIG. 2B). This completes the write operation for DATA2.

Because each of write column select circuits 13a–13b only selects eighteen column lines for each column address applied, a special arrangement is required when memory 10 has nine data pins (i.e., data inputs 20 are nine bits wide). As will be described in more detail below, the arrangement is achieved by pass logic circuits 16a–16d and control circuit 30 in accordance with one embodiment of the present invention.

In accordance with one embodiment of the present invention and as shown in FIGS. 1 and 3A–3D, when memory 10 is configured to Have a nine-bit data width (i.e., data inputs 20 are nine bits wide), control circuit 30 is configured to individually turn on each of pass logic circuits 16a–16d sequentially. This means each of data latches 15a–15d sequentially receives a nine-bit data from data inputs 20 via the respective one of pass logic circuits 16a–16d.

Meanwhile, because each of write column select circuits 13a and 13b, when enabled, still selects eighteen memory cells for every address applied to write column decoder 21, two write operations are thus needed to write two nine bit data into a selected eighteen-bit memory location (see FIGS. 3A–3D). For example, as can be seen from FIG. 3A, when a nine bit data DATA3 is received at data inputs 20, pass logic 16a is turned on while pass logic circuits 16b–16d are turned off. This causes data latch 15a to store DATA3 while data latches 15b–15d do not store valid data. Meanwhile, write column select circuit 13a is enabled in a way that selects eighteen bits to store the data during a write operation. At this time, write column select circuit 13b is not enabled. Because DATA3 is only nine bits wide, the second half of the selected bits by write column select circuit 13a are written with the invalid data stored in data latch 15b at this time.

When another nine-bit data DATA4 is applied to data inputs 20, pass logic 16b is now turned on while pass logic circuits 16a and 16c–16d are turned off. This causes data latch 15b to latch in DATA4 while data latch 15a remains to store DATA3. At this time, write column select circuit 13a selects the same memory bits that were selected during the previous memory operation to store the data DATA3. DATA3 and DATA4 are then written from data latches 15a–15b into the selected memory bits. As can be seen from FIG. 3B, DATA3 is written into the same half of the memory bits twice during two write operations while DATA4 is only written into the memory location once such that the memory location can be filled with two nine-bit data without requiring each of write column select circuits 13a and 13b to select nine column lines for each address applied. This thus causes each of write column select circuits 13a and 13b to have a minimum number of control signal lines for selecting eighteen column lines while memory 10 is still operable to store nine-bit data while neither increasing the number of control signal lines, nor the amount of column decoding logic used to generate them, to that used by a conventional nine bit wide memory.

Figure 3A:
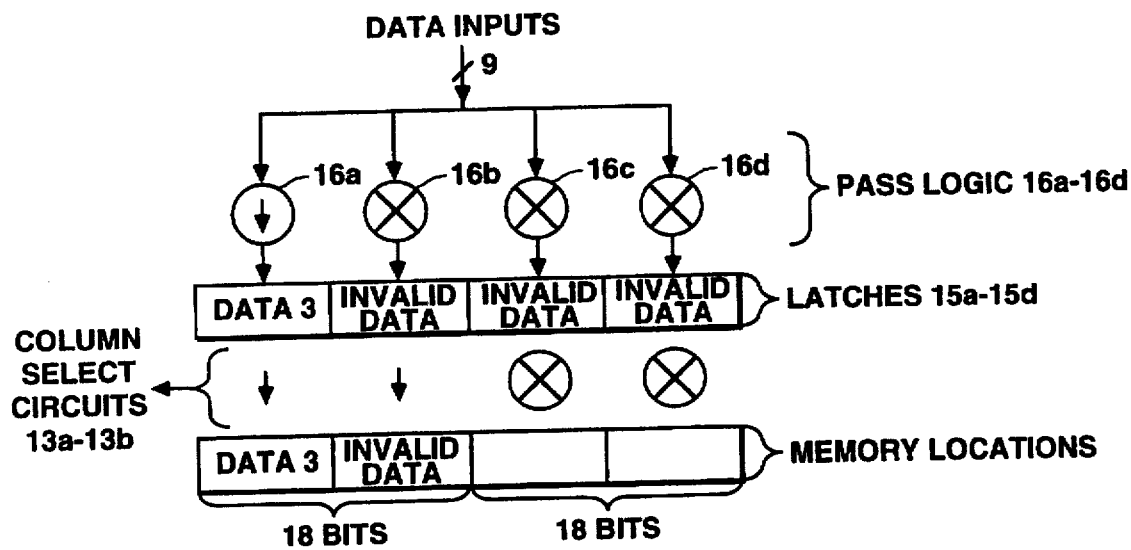
FIGS. 3A through 3D schematically show the write operation of the memory of FIG. 1 when the memory is configured to have a nine-bit data width.
Figure 3B:
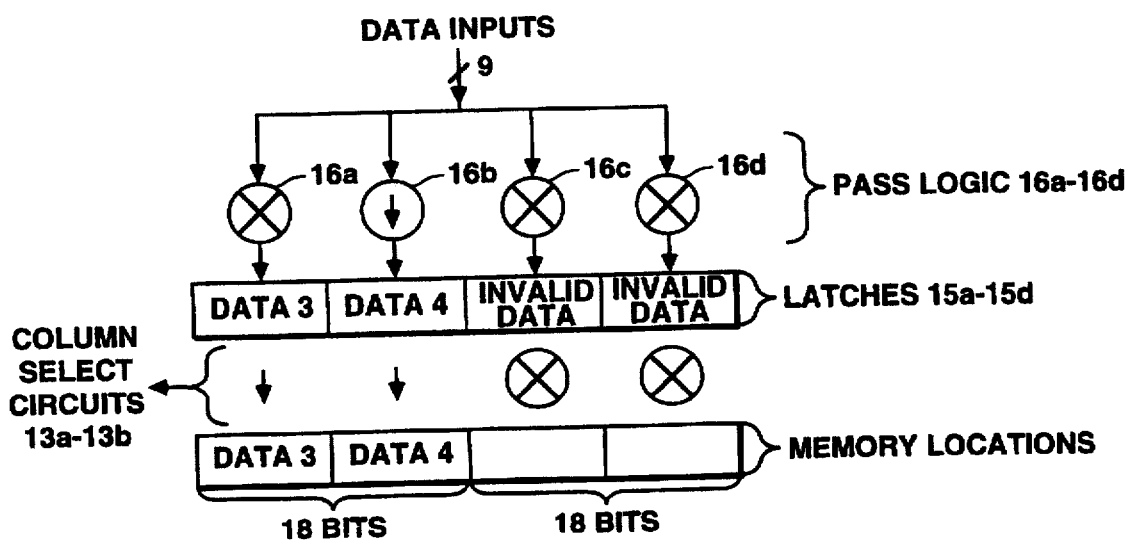
Figure 3C:
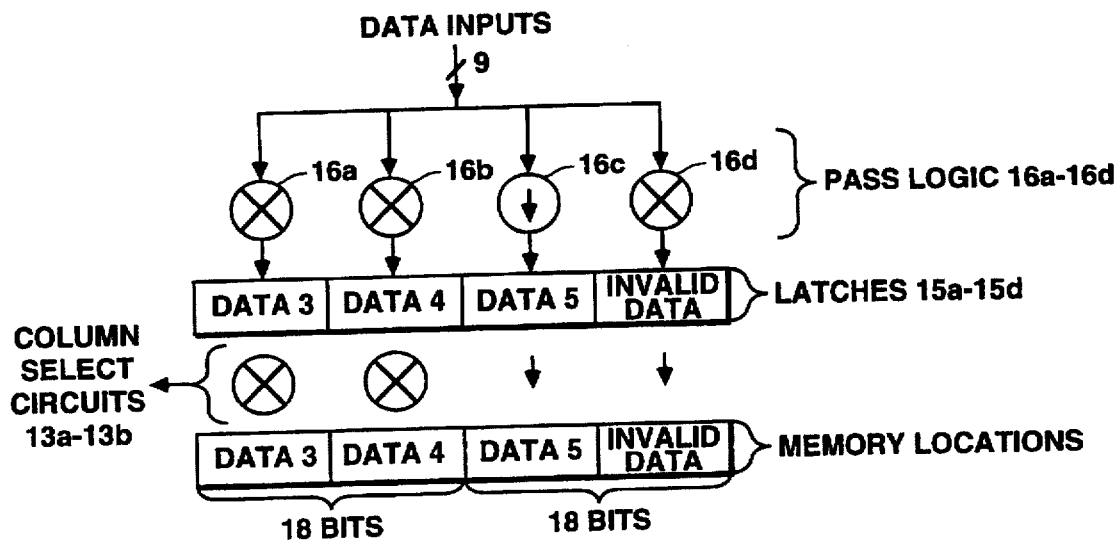
Figure 3D:
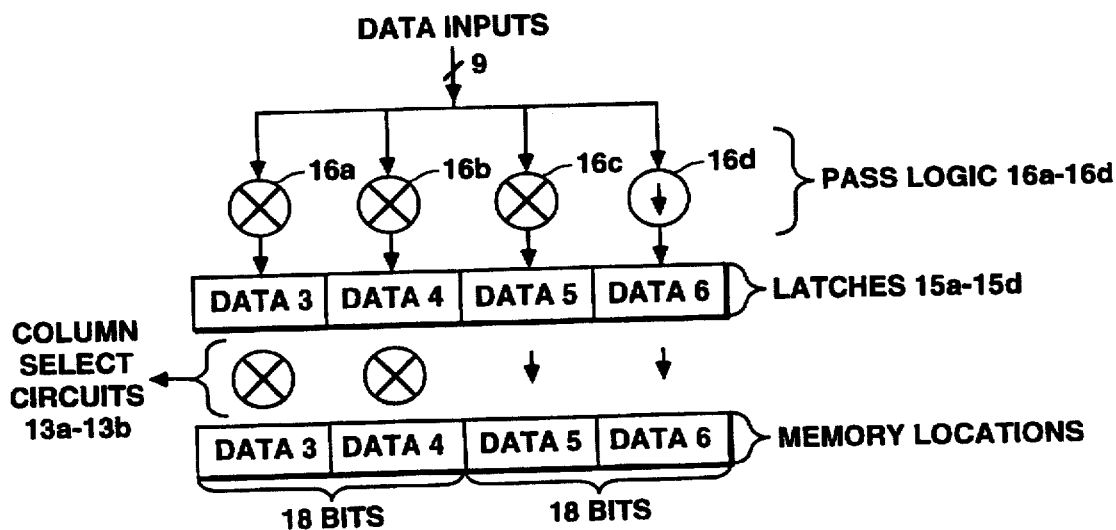

FIGS. 3C and 3D show the write operation of two more nine-bit data (i.e., DATA5 and DATA6) through pass logic circuits 16c and 16d and write column select circuit 13b. As can be seen from FIGS. 3A–3D, the write operations of DATA5 and DATA6 are basically identical to the write operations of DATA3 and DATA4, and thus will not be described in more detail below.

Referring to FIG. 4, the circuit of a pass logic 160 and the circuit of a data latch 150 are schematically shown. Pass logic 160 can be anyone of pass logic circuits 16a–16d of FIG. 1 and latch 150 can be anyone of data latches 15a–15d of FIG. 1. Moreover, data bus 140 can be anyone of data buses 18a–18d of FIG. 1. As can be seen from FIG. 4, pass logic 160 includes switching transistors 161a through 161i, each for connecting one data bit line of data bus 140 to data latch 150. Data latch 150 also includes nine latch circuits 150a through 150i, each being connected to one of the data bit lines of bus 140. Each of switching transistors 161a–161i of pass logic 160 is controlled by the same control signal from control circuit 30 (FIG. 1). The control signal can be one of the PLa through PLd signals from control circuit 30 (see FIGS. 5 and 7). For example, when pass logic 160 is pass logic 16d of FIG. 1, the control signal applied to the gate of each of transistors 161a–161i is the PLd signal.

Each of switching transistors 161a–161i can be any known switching transistor. For example, each of transistors 161a–161i can be a MOSFET (Metal Oxide Semiconductor Field Effect transistor) or a bipolar transistor. In addition, each latch circuit of data latch 150 can also be implemented by other known latching circuit.

Referring now to FIG. 5, the circuit of control circuit 30 of FIG. 1 is shown that includes a configurable counter 180 and a signal generation circuit 181. Signal generation circuit 181 generates the PLa through PLd signals on signal bus 31. The PLa signal is used to control pass logic 16a (FIG. 1). The PLb signal is used to control pass logic 16b (FIG. 1). The PLc signal is used to control pass logic 16c and the PLd signal is used to control pass logic 16d (FIG. 1).

Counter 180 supplies a two-bit count value to signal generation circuit 181 (i.e., the least significant bit LSB and the second least significant bit SLSB). Counter 180 can be, for example, initially configured to supply a two-bit count value and then reconfigured to supply a one-bit count value, or vice versa. When counter 180 is configured or reconfigured to output the two-bit count value, signal generation circuit 181 sequentially asserts the PLa through PLd signals (see FIG. 9). When counter 180 is configured or reconfigured to output the one-bit count value, signal generation circuit 181 asserts the PLa and PLb signals at the same time and then the PLc and PLd signals at the same time (see FIG. 8). In this case, the LSB output of counter 180 is grounded and does not output any count value. The circuit and the reconfiguration arrangement of counter 180 are shown in FIG. 6, which will be described in more detail below. The circuit of signal generation circuit 181 is shown in FIG. 7, which will also be described in more detail below.

FIG. 6 only shows the portion of counter 180 that is responsible for generating the LSB and SLSB count bits. As can be seen from FIG. 6, T-flop circuits 201 through 203, AND gate 215, and inverter 216 and 217 form the counter. Switching elements 210 through 214 are used to configure and reconfigure the counter. When switching elements 210, 210a, and 212–213 are turned on while switching elements 211, 211a, and 214 are turned off, the LSB output of counter 180 supplies the least significant bit and the SLSB output of counter 180 supplies the second least significant bit (See FIG. 9). When switching elements 211, 211a, and 214 are turned on while switching elements 210, 210a, and 212–213 are turned off, T-flop 201 is disconnected from the counter circuit LSB and LSB outputs which are now both connected to ground. Meanwhile, the SLSB output of counter 180 now outputs the least significant bit to signal generation circuit 181 of FIG. 5 (See FIG. 8).

Each of switching elements 210 through 214 can be implemented by known means. For example, a fuse can be used for each of switching elements 210–214. In addition, a metal option can be used during fabrication for each of switching elements 210–214. Moreover, each of switching elements 210–214 can be a MOSFET switching transistor, a CMOS pass gate, a bipolar transistor, an electrically programmable floating gate transistor, and/or other known switching element.

FIG. 7 shows the circuit of signal generation circuit 181 of FIG. 5. As can be seen from FIG. 7, each of the PLa through PLd signals is sequentially asserted by the SLSB and LSB signals when the LSB output of counter 180 (FIGS. 5 and 6) outputs the least significant bit of the count value (see FIG. 9). When this occurs, memory 10 of FIG. 1 operates with the nine-bit data width and FIGS. 3A–3D illustrate the write operations.

Figure 8:
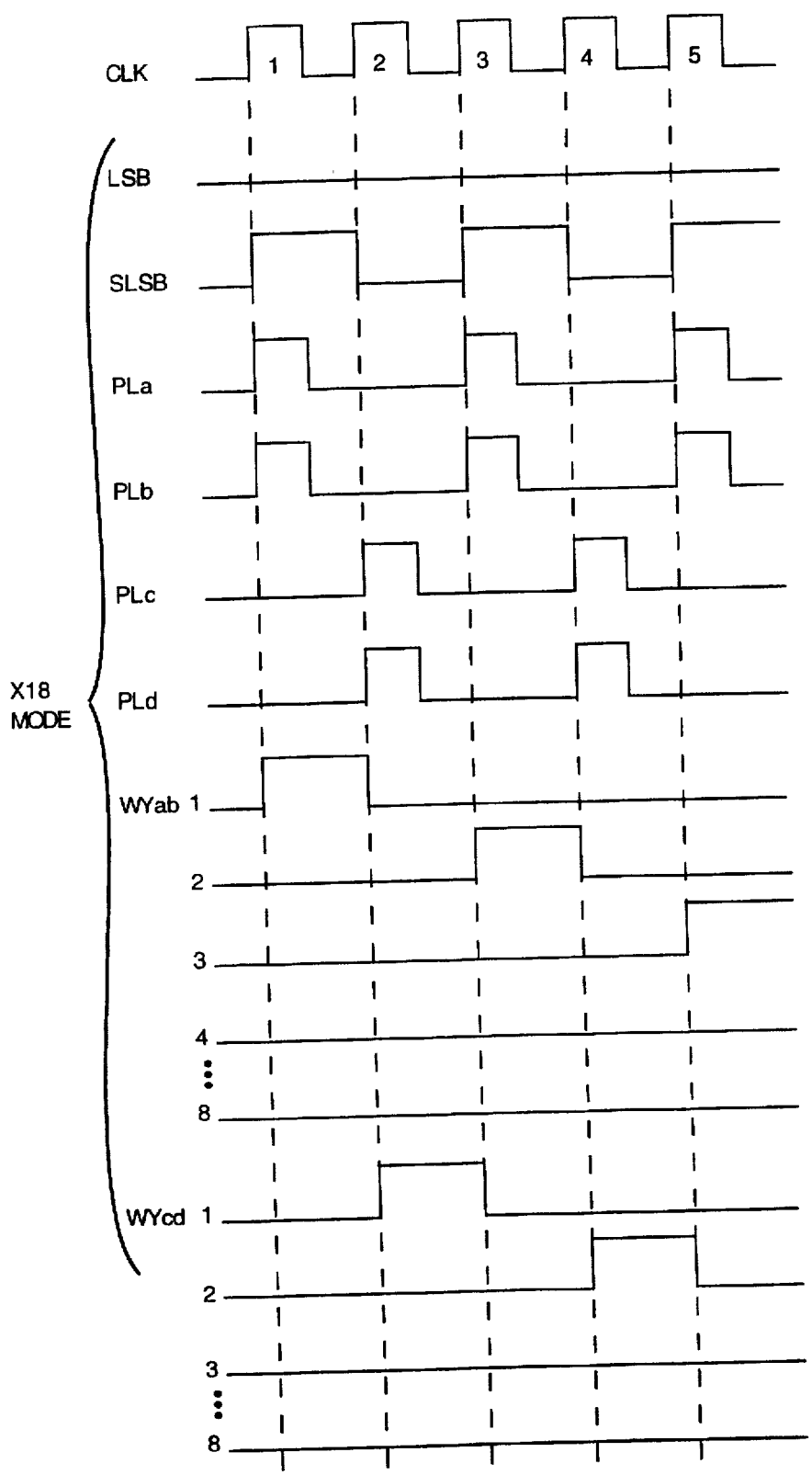
FIG. 8 shows in waveform diagram form various signals for writing of the memory of FIGS. 1–7 when the memory is configured to have the eighteen-bit data width.
Figure 9:
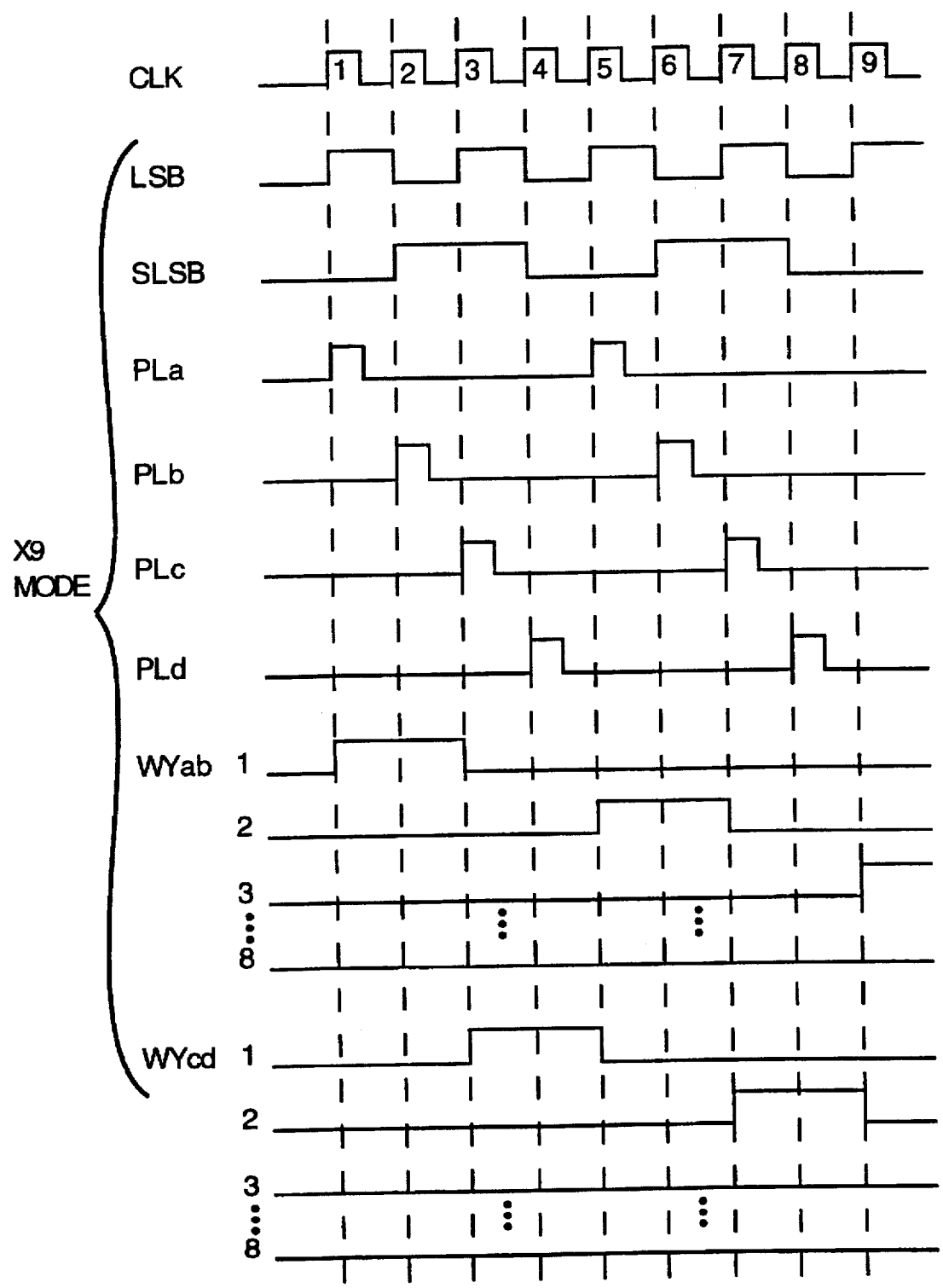
FIG. 9 shows in waveform diagram form various signals for writing of the memory of FIGS. 1–7 when the memory is configured to have the nine-bit data width.

When the LSB and LSB outputs of counter 180 are grounded and the SLSB output of counter 180 outputs the least significant bit of the count value, the PLa and the PLb signals are alternately asserted with the PLc and PLd signals (see FIG. 8). When this occurs, memory 10 of FIG. 1 operates with the eighteen-bit data width and FIGS. 2A–2B show the write operations.

The read operation is performed similarly to the write operation as described above. Further illustration of the read circuitry is not shown in order not to unnecessarily obscure the description of the present invention.

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. A method of writing a first and a second data of a first data width into a memory that stores data at a second data width greater than the first data width, comprising the steps of:

(A) selecting via a select circuit a plurality of memory cells that correspond to the second data width from a memory array of the memory;

(B) writing the first data into a first number of the memory cells corresponding to the first data width while writing invalid data into a second number of the memory cells also corresponding to the first data width during a first write operation;

(C) writing the first data into the first number of the memory cells again and the second data into the second number of the memory cells during a second write operation.

2. The method of claim 1, wherein the step (B) further comprises the step of enabling a first latch to receive the first data while disabling a second latch from receiving any data such that the memory cells are written with the first data and the invalid data stored in the second latch during the first write operation, wherein the first and second latches are coupled to the memory cells via the select circuit.

3. The method of claim 2, wherein the step (C) further comprises the step of disabling the first latch from receiving any data while enabling the second latch to receive the second data such that the memory cells are written with the first and second data during the second write operation.

4. The method of claim 3, further comprising the steps of (i) selecting via the select circuit a second plurality of memory cells that correspond to the second data width from the memory array;

(ii) writing a third data of the first data width into a first number of the second plurality of memory cells corresponding to the first data width while writing invalid data into a second number of the second plurality of memory cells also corresponding to the first data width during a third write operation;

(iii) writing the third data into the first number of the second plurality of memory cells again and a fourth data of the first data width into the second number of the second plurality of memory cells during a fourth write operation.

5. The method of claim 1, wherein the memory is a first-in-first-out (FIFO) memory.

6. The method of claim 1, wherein the first data width is half of the second data width.

7. An apparatus of writing a first and a second data of a first data width into a memory that stores data at a second data width greater than the first data width, comprising:

(A) a select circuit that selects a plurality of memory cells that correspond to the second data width from a memory array of the memory;

(B) a first logic that causes writing of the first data into a first number of the memory cells corresponding to the first data width while allowing invalid data to be written into a second number of the memory cells also corresponding to the first data width during a first write operation;

(C) a second logic that causes writing of the first data into the first number of the memory cells again and the second data into the second number of the memory cells during a second write operation.

8. The apparatus of claim 7, further comprising a first and a second latch coupled to the select circuit.

9. The apparatus of claim 8, wherein the first logic enables the first latch to receive the first data while disabling a second latch from receiving any data such that the first number of the memory cells are written with the first data and the second number of the memory cells are written with the invalid data stored in the second latch during the first write operation, wherein the second logic disables the first latch from receiving any data while enabling the second latch to receive the second data such that the first number of the memory cells are written again with the first data and the second number of memory the memory cells are written with the second data during the second write operation.

10. The apparatus of claim 7, wherein the memory is a first-in-first-out (FIFO) memory.

11. The apparatus of claim 7, wherein the first data width is half of the second data width.

12. A memory, comprising:

(A) a memory array;

(B) a select circuit that selects a plurality of memory cells that corresponds to a first and second data width from the memory array;

(C) a first pass circuit that, when enabled, passes a first data of the first data width less than the second data width to the select circuit and a second pass circuit that, when enabled, passes a second data having the second data width to the select circuit; and (D) a configurable control circuit that enables the first and second pass circuits, wherein when the control circuit is configured to enable the first and second pass circuits at substantially the same time, the memory operates with the first data width, wherein when the control circuit is configured to enable the first and second pass circuits alternately, the memory operates with the second data width without changing the select circuit and only requires a number of select circuit control signals equal to those needed to operate at the first data width.

13. The memory of claim 12, wherein each of the first and second pass circuits further comprises (I) a pass gate that is enabled by the control circuit;

(11) a latch coupled to the pass gate and the select circuit, the latch receives and stores the respective one of the first and second data from the pass gate when the pass gate is enabled, and applies its stored contents to the select circuit.

14. The memory of claim 12, wherein when the memory operates with the second data width, the control circuit (1) enables the first pass circuit to receive the first data while disabling the second pass circuit from receiving any data such that the memory cells are only written with the first data during a first write operation, and (2) disables the first pass circuit from receiving any data while enabling the second pass circuit to receive the second data such that the memory cells are written with the first and second data during a second write operation.

15. The memory of claim 12, wherein the memory is a first-in-first-out (FIFO) memory.

16. The memory of claim 12, wherein the first data width is half of the second data width.

17. A method of reading a first and a second data of a first data width from a memory that retrieves data at a second data width greater than the first data width, comprising the steps of:

(A) selecting via a select circuit a plurality of memory cells that correspond to the second data width from a memory array of the memory;

(B) reading the first data from a first number of the memory cells corresponding to the first data width while reading invalid data from a second number of the memory cells also corresponding to the first data width during a first read operation;

(C) reading the first data from the first number of the memory cells again and the second data from the second number of the memory cells during a second read operation.

18. The method of claim 17, wherein the memory is a first-in-first-out (FIFO) memory.

19. The method of claim 17, wherein the first data width is half of the second data width.

* * * * *